Jan. 3, 1950 A. S. KHOURI ET AL 2,493,199

ELECTRIC CIRCUIT COMPONENT

Filed Aug. 15, 1947

INVENTOR.
ALFRED S. KHOURI
BY WILLIAM C. FISCHER

John W. Michael
ATTORNEY.

Patented Jan. 3, 1950

2,493,199

UNITED STATES PATENT OFFICE 2,493,199

ELECTRIC CIRCUIT COMPONENT

Alfred S. Khouri and William C. Fischer, Milwaukee County, Wis., assignors to Globe-Union Inc., Milwaukee, Wis., a corporation of Delaware.

Application August 15, 1947, Serial No. 768,734

1 Claim. (Cl. 178—44)

This invention relates to improvements in electronic circuit components and particularly to a unit including all of the electrical elements commonly employed in coupling various stages of an electronic device such as an amplifier.

Heretofore it was necessary to employ two separate capacitors and two separate resistors in coupling the several stages of an electronic circuit, which required the making of eight or nine soldered connections, any one of which might be erroneously or imperfectly made and might result in rejection of the completed device. The use of four separate electrical elements requires considerable space and the making of the large number of connections necessary therewith requires a material amount of the time of a semiskilled person. The connectors required between a large number of separate elements produce electrical characteristics dependent on the spatial relationship of the connectors and such relationship frequently changes in use which adversely affects the dependability of performance of the completed device.

It is accordingly one object of the present invention to provide a unitary circuit component which includes all of the electrical elements required in coupling two stages of an electronic device.

Another object of the invention is to provide an electronic interstage coupler in which the necessary capacitors and resistors are permanently mounted on a single plate of insulation bearing permanent connections between the capacitors and resistors and requiring only the making of a minimized number of connections between the several electronic stages.

Another object of the invention is to provide an electronic circuit interstage coupler in which the necessary electrical elements are permanently placed as closely together as possible consistent with obtaining the desired electrical characteristics of the several elements and in which the electrical relations between such elements and their connections is permanently fixed.

And a further object of the invention is to provide an electronic circuit interstage coupling unit in which the number of electrical connections to be made and the possibility of making erroneous or imperfect connections are minimized, which requires less space than heretofore, which is less expensive than heretofore to incorporate in a finished device, and in which constancy and dependability is assured in the electrical inter-relations of the elements and at least a number of their connections and in which each unit is an exact duplicate of every other unit.

Objects and advantages other than those above set forth will be apparent from the following description when read in connection with the accompanying drawing in which.

Figure 1:
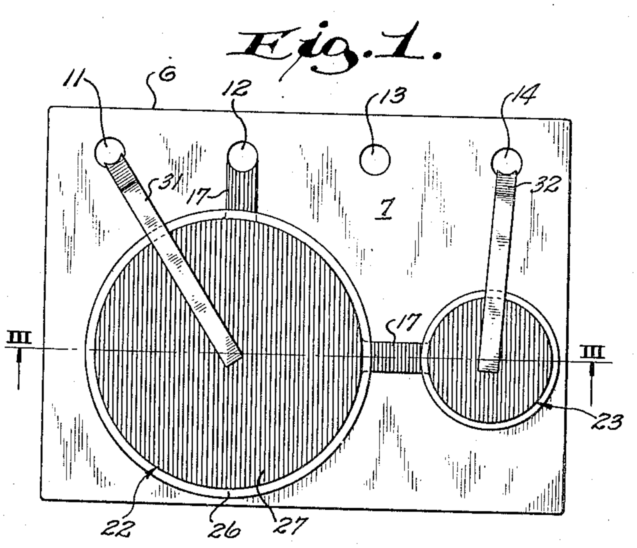
Fig. 1 is a top plan view of the coupler of the present invention.
Figure 2:
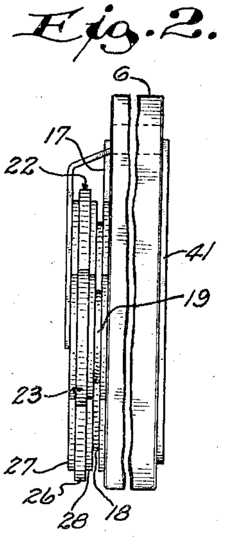
Fig. 2 is an end elevation view of Fig. 1.
Figure 3:
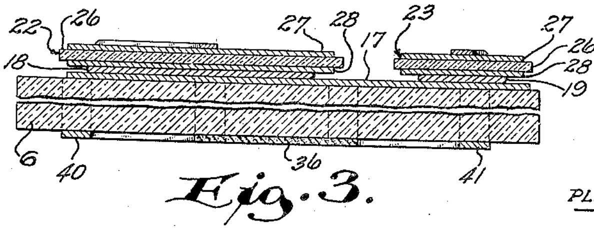
Fig. 3 is a cross sectional view on the plane of line III—III of Fig. 1.

Generally, the present electronic circuit interstage coupling unit comprises a block or plate of a material of high insulating value and substantially unaffected by changes in atmospheric conditions. A plurality of capacitors of different sizes are permanently mounted on the block and a plurality of resistors are permanently formed on the block. All of the connections required between the several capacitors and the several resistors are permanently formed on the plate and only the connections required for connection of the coupler between several stages are separate connectors such as flexible leads.

The various electrical elements and their connections are now so placed on the block that there are no cross-connections on the same block surface and that there can be no change in the electrical relations of the elements or their connections. Of course, if it is desired to change the connections of the coupler, it may be necessary to bridge over one of the permanently formed connectors by a separate conductor as is known.

Referring particularly to the drawings, the numeral 6 generally designates a block or plate of high insulation value material and of a character substantially unchanged regardless of the changes in ambient atmosphere, the material preferably being a ceramic and preferably a steatite mixture. The block need be only of such size as to have adequate mechanical strength and surface area for placing the various electrical elements and their connections in the proper spacing to obtain the desired electrical characteristics therebetween. Such block is readily formed to sufficiently precise dimensions which will not change during use, and may be made in any desired shape. The surface 7 of the block is herein designated as the top and the surface 8 is herein designated as the bottom of the block, but the block may be positioned as desired in the completed device. The block is formed with a number of apertures 11—14 inclusive adjacent one edge thereof for a purpose which will appear hereinafter.

A band 17 of conductive metallic material such as silver is formed from block aperture 12 over the top 7 by any one of the known methods such as painting or otherwise applying a compound of the conductive material in solution, in a given location and of a given size, and then reducing the compound to metal as by heating, which causes the metal to interlock with the surface of the block.

Connectors 40—43 inclusive are formed in spaced relation on the bottom of the block in the same manner as indicated for connector 17, the gaps between adjacent ends of the connectors 40, 41 and 42, 43 being provided for other elements of the circuit. The connectors 17 and 40—43 preferably extend on the surface of the apertures to which they severally lead.

Resistors 35, 36 are now formed on the bottom of the block as by painting or otherwise applying a coat of carbon-containing material in the gaps between the adjacent ends of the connectors, the resistors overlapping the ends of the connectors as is usual in forming a good electrical connection. It will be understood that the resistors may be hardened or set by heating and that it is desirable to coat the resistors for protection against abrasion and to minimize absorption of moisture as is well known.

Masses of solder are then placed on the conductor 17 as indicated at 18 and 19 and are heated to cause joining of the conductor and solder, to spread the solder over areas of different size. When the conductors are silver, a silver-containing solder is used to prevent the absorption of silver from the conductors.

A plurality of capacitors generally designated 22 and 23 are formed from similar material and in a similar manner. Such capacitors severally comprise a plate 26 of high dielectric constant material such as a ceramic made of basically titanium dioxide, such as rare earth or various titanates, and conductive plates 27 and 28 which are formed on opposite sides of the dielectric as by coating the desired areas on the dielectric sides with silver as above indicated. The capacitors 22 and 23 are then placed respectively on the solder masses 18 and 19 and heat is applied to cause joining of the capacitor plates 28 with the masses of solder. Conductors 31 and 32 are then severally attached to the plates 27 of the several capacitors and extend respectively into the apertures 11 and 14 in the plate. It will be understood that the capacitors vary in size as required for coupling the several stages of an electronic device and that the use of a titanium-containing material produces a relatively high capacity in small dimensions.

Conductors 46–49, inclusive, are now severally inserted in the block apertures 11 to 14, inclusive, and the apertures are filled with solder to join the several connectors and conductors leading to the same aperture. It will be understood that eyelets, lugs, plugs or other connecting means, known to the art, may be used in place of conductors 46–49.

Figure 5:
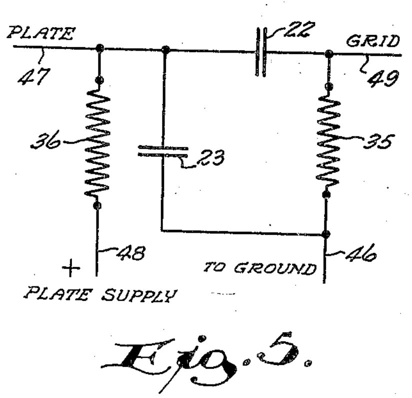
Fig. 5 is a diagram of the electrical elements of the coupler and their connections.
Figure 4:
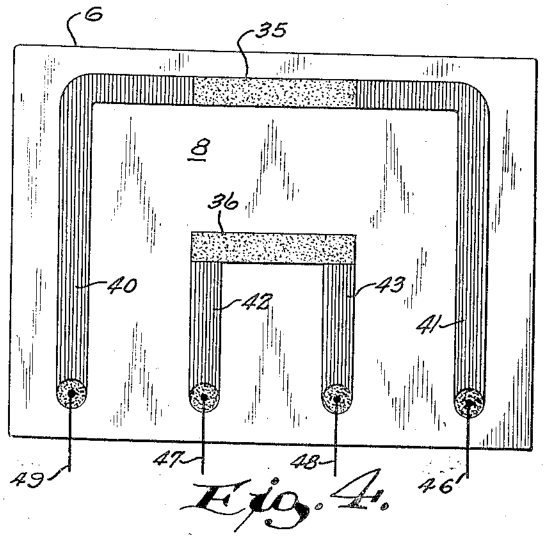
Fig. 4 is a bottom plan view of the present structure.

The circuit of Fig. 5 is then produced in which only four connections need be made to couple two stages of an electronic device. In such circuit, capacitor 23 functions as a tube plate radio frequency bypass and capacitor 22 is the so-called coupling capacitor. Resistor 36 is the tube plate load resistor and resistor 35 is connected with the tube grid.

It will thus be seen that the present construction provides a unitary interstage coupler for electronic devices in which all of the electrical elements required in the coupling circuit are permanently fixed in predetermined relation with all the intra-coupling connections made before insertion of the coupler in the device. Hence, the coupler and its connections can be tested as a unit before insertion of a coupler in a device which assures that such units will be perfect and only a minimum number of connections need be made between the coupler and the several stages. The coupler is more compact than the several elements used heretofore and the electrical characteristics and relations of both the electrical elements and the intra-coupling circuit connections remain fixed in use. Each unit is an exact duplicate of every other unit, thus further facilitating assembly of the coupler with the other portions of a complete electronic device.

Although but one embodiment of the present invention has been illustrated and described, it will be apparent to those skilled in the art that various changes and modifications may be made therein without departing from the spirit of the invention or from the scope of the appended claim.

We claim:

A unitary coupler for interconnecting several stages of an electronic circuit, comprising a rigid ceramic plate having a plurality of alined apertures therethrough adjacent one edge thereof, a resistor formed on one surface of said plate, a pair of conductors formed on said surface and connecting each end of said resistor to an outer one of said apertures, a second resistor formed on said surface, a pair of conductors formed on said surface and connecting each end of said second resistor to an inner one of said apertures, a band of conductive material formed on the other surface of said plate and connected with an inner one of said apertures, a pair of capacitors each consisting of a high dielectric constant ceramic base having conductive plates coated on the opposite sides thereof, said capacitors being relatively spaced and fixed to said other surface with a conductive plate of each connected to said conductive band, and a conductor connected to each of the other conductive plates and with the outer ones of said apertures, each conductor in an aperture being connected whereby said unitary coupler may be readily utilized to interconnect several stages of an electronic circuit.

ALFRED S. KHOURI.
WILLIAM C. FISCHER.

REFERENCES CITED

The following references are of record in the file of this patent:

UNITED STATES PATENTS

| Number | Name | Date |
|---|---|---|
| 1,718,993 | Wermine | July 2, 1929 |
| Re. 20,224 | Van Billiard | Dec. 29, 1936 |

FOREIGN PATENTS

| Number | Country | Date |
|---|---|---|
| 349,706 | Great Britain | June 4, 1931 |
| 378,905 | Italy | Feb. 27, 1940 |

OTHER REFERENCES

"Printed Circuit Wiring," in "Electronics Industries" for April 1946, pgs. 90, 91, 120, 122. (Copy in Division 10.)